United States Patent
Kim et al.

(10) Patent No.: US 8,344,497 B2
(45) Date of Patent: Jan. 1, 2013

(54) SEMICONDUCTOR PACKAGE AND ELECTRONIC DEVICE HAVING THE SAME

(75) Inventors: Pyoung-Wan Kim, Suwon-si (KR);
Eun-Chul Ahn, Yongin-si (KR);
Teak-Hoon Lee, Hwaseibg (KR);
Chul-Yong Jang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 615 days.

(21) Appl. No.: 12/240,036

(22) Filed: Sep. 29, 2008

(65) Prior Publication Data

US 2009/0096071 A1     Apr. 16, 2009

(30) Foreign Application Priority Data

Oct. 16, 2007   (KR) .................. 10-2007-0104035

(51) Int. Cl.
*H01L 23/48* (2006.01)

(52) U.S. Cl. .............. 257/692; 257/775; 257/E23.07; 257/E23.152

(58) Field of Classification Search .......... 257/692, 257/775, E23.046, E23.152
See application file for complete search history.

(56) References Cited

U.S. PATENT DOCUMENTS

| | | | | |
|---|---|---|---|---|
| 4,109,096 A * | 8/1978 | Dehaine | ................... | 174/253 |
| 6,037,662 A * | 3/2000 | Yoon et al. | .................. | 257/735 |
| 6,362,429 B1 * | 3/2002 | Moden | ................... | 174/94 R |
| 6,624,504 B1 * | 9/2003 | Inoue et al. | .................. | 257/668 |
| 6,770,547 B1 * | 8/2004 | Inoue et al. | .................. | 438/496 |
| 6,822,317 B1 * | 11/2004 | Inoue et al. | .................. | 257/668 |
| 6,930,388 B2 * | 8/2005 | Yamaguchi et al. | ......... | 257/737 |
| 7,057,283 B2 * | 6/2006 | Inoue et al. | .................. | 257/737 |
| 7,115,975 B2 * | 10/2006 | Mori | ................... | 257/668 |
| 2002/0063332 A1 * | 5/2002 | Yamaguchi et al. | ......... | 257/738 |
| 2004/0245530 A1 | 12/2004 | Kameyama et al. | | |
| 2006/0151860 A1 | 7/2006 | Islam et al. | | |
| 2009/0096071 A1 * | 4/2009 | Kim et al. | ................... | 257/668 |
| 2010/0000772 A1 * | 1/2010 | Letterman et al. | | |

FOREIGN PATENT DOCUMENTS

| | | |
|---|---|---|
| JP | 2004-363380 | 12/2004 |
| KR | 2004-105560 | 12/2004 |
| KR | 2005-48323 | 5/2005 |
| WO | WO 2006068641 A1 * | 6/2006 |

* cited by examiner

*Primary Examiner* — David Vu
*Assistant Examiner* — Earl Taylor
(74) *Attorney, Agent, or Firm* — Stanzione & Kim, LLP

(57) ABSTRACT

A semiconductor package may include a semiconductor chip, a molding layer which molds the semiconductor chip, and an interconnection which extends crossing an interface between the semiconductor chip and the molding layer and connects the semiconductor chip to an outside, wherein a shape of the interconnection is changed along the extended length thereof. According to the present invention, even if a mechanical stress or a thermal stress is applied to an interconnection, a crack does not occur in the interconnection or the interconnection is not disconnected. Therefore, a reliability of the semiconductor package is improved.

12 Claims, 6 Drawing Sheets

SEMICONDUCTOR PACKAGE AND ELECTRONIC DEVICE HAVING THE SAME

CROSS-REFERENCE TO RELATED APPLICATIONS

This U.S. non-provisional patent application claims priority under 35 U.S.C. §119 of Korean Patent Application No. 2007-104035, filed on Oct. 16, 2007, the entire contents of which are hereby incorporated by reference.

BACKGROUND OF THE INVENTION

1. Field of the Invention

The present general inventive concept disclosed herein relates to a semiconductor, and more particularly, to a semiconductor package with an improved reliability, and an electronic device having the same.

2. Description of the Related Art

Generally, a semiconductor package has a structure that a semiconductor chip is protected from an external environment by being molded with an epoxy molding compound (EMC). FIG. 1 is a top plan view illustrating a conventional semiconductor package. Referring to FIG. 1, a semiconductor chip 11 includes a plurality of die pads 13, and the die pads 13 are electrically connected to outer terminals 14 by interconnections 15. The semiconductor chip 11 is molded with a molding layer 12 such as an epoxy molding compound (EMC). A semiconductor package 10 is electrically connected to an external device through the outer terminal 14.

An interface 16 is formed between the semiconductor chip 11 and the molding layer 12. Since the semiconductor chip 11 and the molding layer 12 have different materials, a physical characteristic such as a mechanical characteristic and a thermal characteristic may be different. A mechanical stress or a thermal stress which is applied to a semiconductor package 10 may be concentrated on the interface 16. If a mechanical stress or a thermal stress is concentrated on the interface 16, a crack may occur at the interface 16, or a lamination phenomenon in which the semiconductor chip 11 and the molding layer 12 are separated from each other may occur. A crack or a lamination phenomenon may cause a crack of the interconnection 15 or a disconnection of the interconnection 15. Thus, a reduction in reliability of the semiconductor package 10, such as an electrical malfunction, may occur.

SUMMARY OF THE INVENTION

Example embodiments provide a semiconductor package. The semiconductor package may include a semiconductor chip, a molding layer which molds the semiconductor chip, and an interconnection which extends crossing an interface between the semiconductor chip and the molding layer and connects the semiconductor chip to an outside, wherein a shape of the interconnection is changed along the extended length thereof.

Additional aspects and utilities of the present general inventive concept will be set forth in part in the description which follows and, in part, will be obvious from the description, or may be learned by practice of the general inventive concept.

The foregoing and/or other aspects and utilities of present general inventive concept can be achieved by providing a semiconductor package, including a semiconductor chip, a molding layer which molds the semiconductor chip, and an interconnection which extends crossing an interface between the semiconductor chip and the molding layer, and connects the semiconductor chip to an outside, wherein a shape of the interconnection is changed along the extended length thereof.

The foregoing and/or other aspects and utilities of present general inventive concept can also be achieved by providing a semiconductor package, including a semiconductor chip including die pads and an interconnection which connects the die pads to an outside of the semiconductor package, the interconnection including an altered shape portion at an interface between the semiconductor chip and a molding layer package to provide a reinforced strength at the interface.

The altered shape portion of the interconnection may include a larger cross-sectional area than other portions of the interconnection.

The altered shape portion of the interconnection may include a 90° bend to extend along a portion of the interface and a second 90° bend to extend perpendicular to and away from the interface through the semiconductor package.

The package may include a molding layer surrounding the chip.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
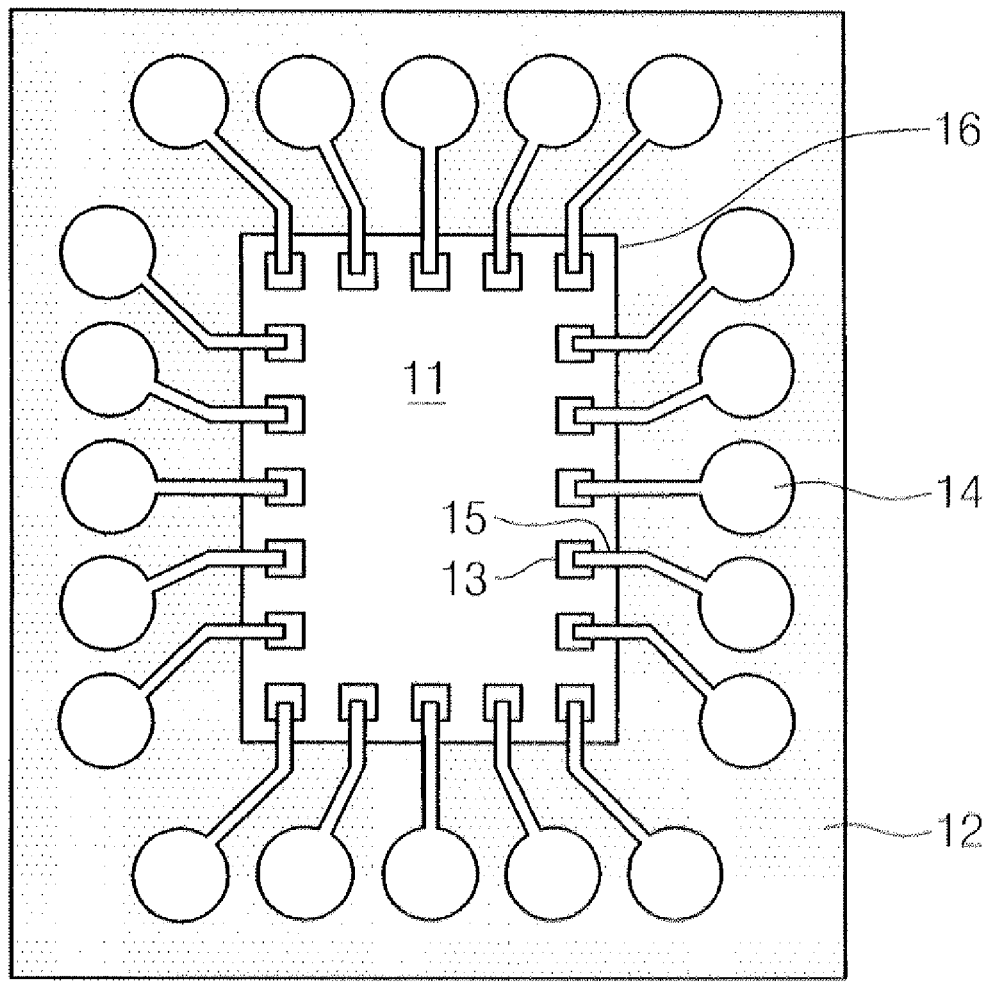
FIG. 1 is a top plan view depicting a semiconductor package in accordance with a conventional art.

The present general inventive concept will now be described more fully hereinafter with reference to the accompanying drawings, in which embodiments of the general inventive concept are shown. This invention may, however, be embodied in many different forms and should not be construed as limited to the embodiments set forth herein. Rather, these embodiments are provided so that this disclosure will be thorough and complete, and will fully convey the scope of the general inventive concept to those skilled in the art. In the drawings, the size and relative sizes of layers and regions may be exaggerated for clarity. Like numbers refer to like elements throughout.

Figure 2:
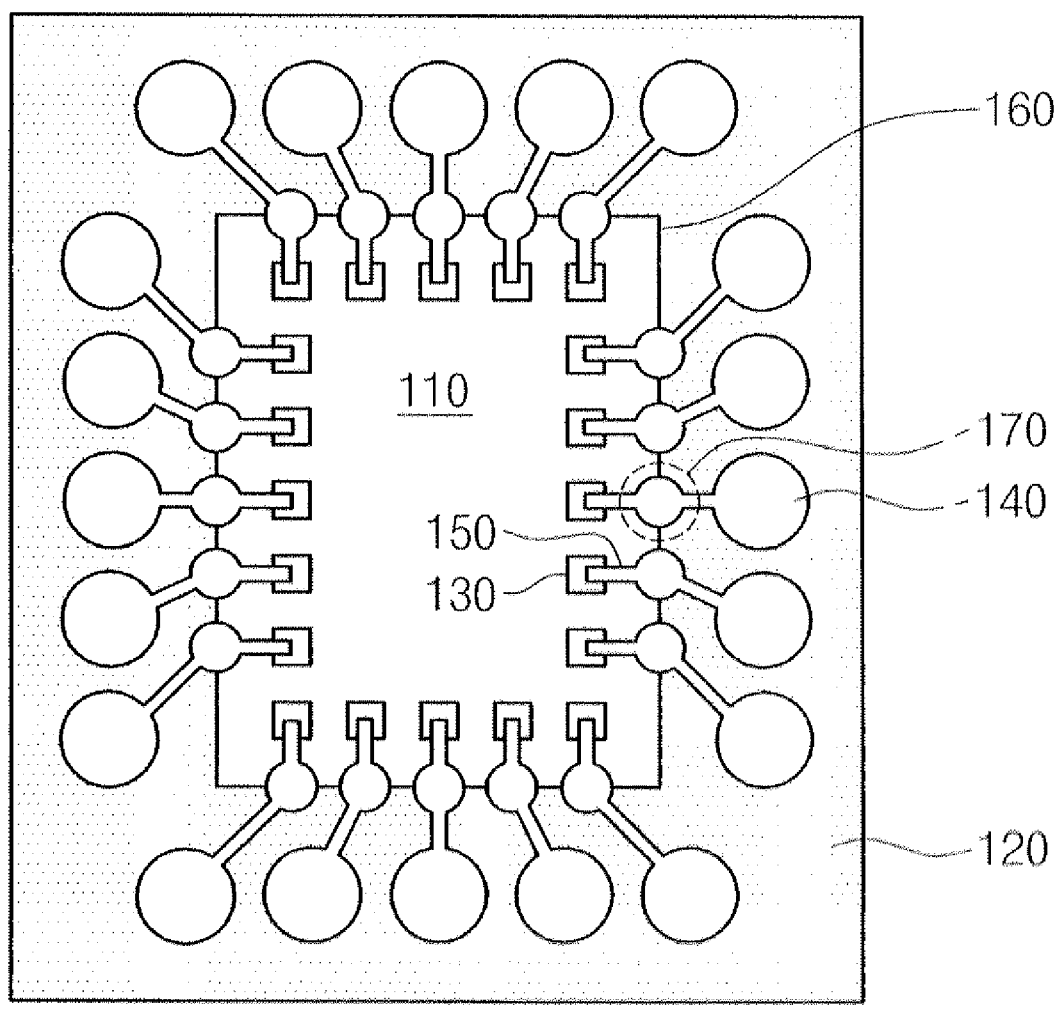
FIG. 2 is a top plan view depicting a semiconductor package in accordance with an embodiment of the present general inventive concept.

FIG. 2 is a top plan view depicting a semiconductor package in accordance with an embodiment of the present general inventive concept.

Referring to FIG. 2, a semiconductor package 100 may have a molded structure in which a semiconductor chip 110 is molded by a molding layer 120 such as an epoxy molding compound (EMC). Each of the semiconductor chip 110 and the molding layer 120 may have a flat structure of a square. The semiconductor chip 110 may have a plurality of die pads 130. The semiconductor package 100 may include a plurality of outer terminals 140 which are electrically connected to the plurality of die pads 130.

The die pads 130 may be arranged in a row to be adjacent to four sides (i.e., an upper side, a lower side, a right side and a left side) of the semiconductor chip 110. Alternatively, the die pads 130 may be arranged in a row to be adjacent to two sides (i.e., upper and lower sides or right and left sides) of the semiconductor chip 110. In other words the die pads 130 may extend along and adjacent to each of the four sides of the semiconductor chip 110, in one long row. Alternatively, the die pads 130 may be arranged in a row on a center portion of the semiconductor chip 110. The plurality of die pads 130 may be electrically connected to the plurality of outer terminals 140 through a plurality of interconnections 150. The outer terminals 140 may be arranged in a row around the four sides of the semiconductor chip 110.

The die pads 130 may be arranged inside of the semiconductor chip 110 but the outer terminals 140 may be arranged outside of the semiconductor chip 110. Since the interconnection 150 extends from the die pads 130 to the outer terminals 140, the interconnection 150 may overlap with an interface 160 disposed between the semiconductor chip 110 and the molding layer 120. The interconnection 150 may be a pattern which is redistributed. The interconnection 150 may be directly formed on the interface 160 or an insulating layer maybe disposed between the interconnection 150 and the interface 160.

A width of a portion of the interconnection 150 which overlaps with the interface 160 may be larger than a width of a portion of the interconnection 150 which does not overlap with the interface 160, as described later with reference to FIGS. 3 through 8. As an example, as described later with reference to FIGS. 3 through 7, the portion of the interconnection 150 which overlaps with the interface 160 may have a nonlinear shape and the portion of the interconnection 150 which does not overlap with the interface 160 may have a linear shape. Alternatively, as described later with reference to FIG. 8, the portion of the interconnection 150 which overlaps with the interface 160 may have a linear shape extending along the interface 160 and the portion of the interconnection 150 which does not overlap with the interface 160 may have a linear shape extending in a direction which is perpendicular to the interface 160.

Figure 3:
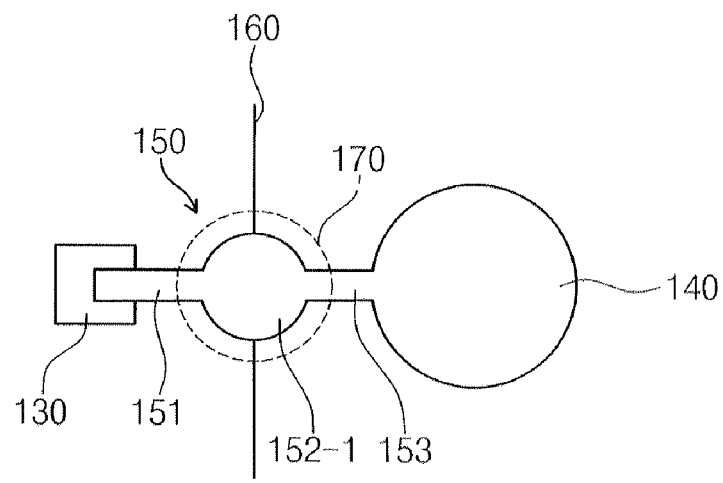
FIG. 3 is a top plan view depicting a portion of FIG. 2.

FIG. 3 is a top plan view depicting a portion of FIG. 2. Referring to FIG. 3, the interconnection 150 may include a first interconnection portion 151 of a linear shape, a second interconnection portion 152-1 of a round shape and a third interconnection portion 153 of a linear shape. The second interconnection portion 152-1 may alternatively have an oval shape. The first interconnection portion 151 extends in a direction which is perpendicular to an extending direction of the interface 160 and is electrically connected to the die pad 130. The third interconnection portion 153 also extends in a direction which is perpendicular to an extending direction of the interface 160 and is electrically connected to the outer terminal 140. The second terminal 152-1 is disposed at a position which overlaps with the interface 160 located between the first interconnection portion 151 and the third interconnection portion 153. A width of the second interconnection portion 152-1 is relatively larger than widths of the first and third interconnections portions 151 and 153. Therefore, even though a mechanical stress or a thermal stress is concentrated on the interface to cause a crack on the interface 160, a crack which occurs on the interconnection 150 does not cause a disconnect due to a thick width of the second interconnection portion 152-1.

FIGS. 4 to 8 are top plan views depicting different embodiments of interconnection depicted in FIG. 3. Since interconnections depicted in FIGS. 4 to 8 are similar to the interconnection depicted in FIG. 3, the description of common features already discussed above will be omitted for brevity, while any new or different features will be described in further detail below.

Figure 4:
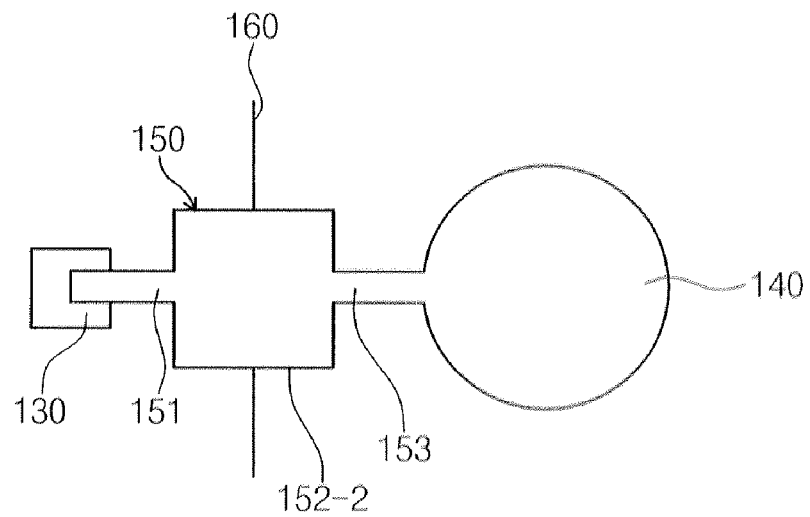
FIGS. 4 to 8 are top plan views depicting different embodiments of interconnection depicted in FIG. 3.
Figure 5:
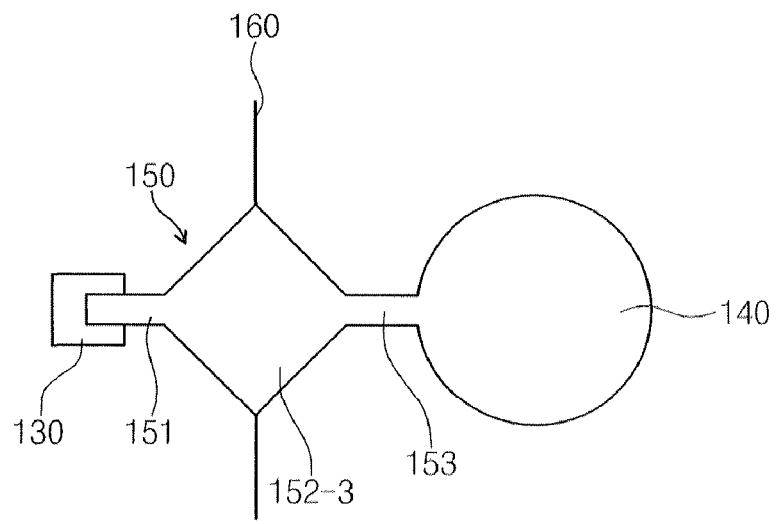
Figure 6:
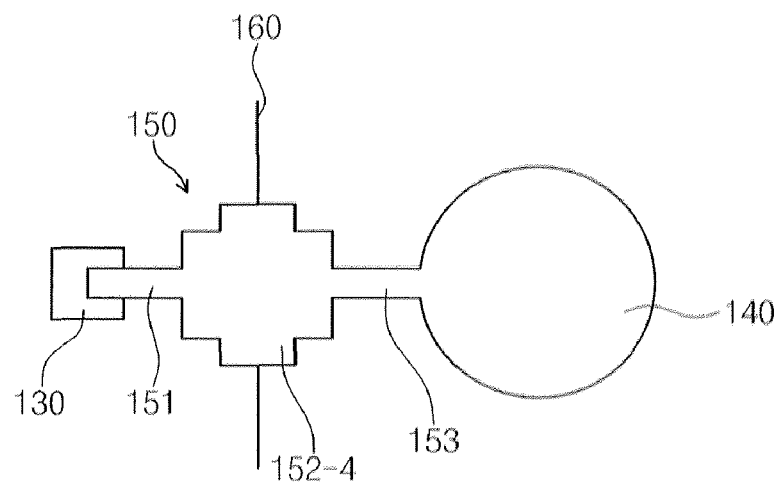
Figure 7:
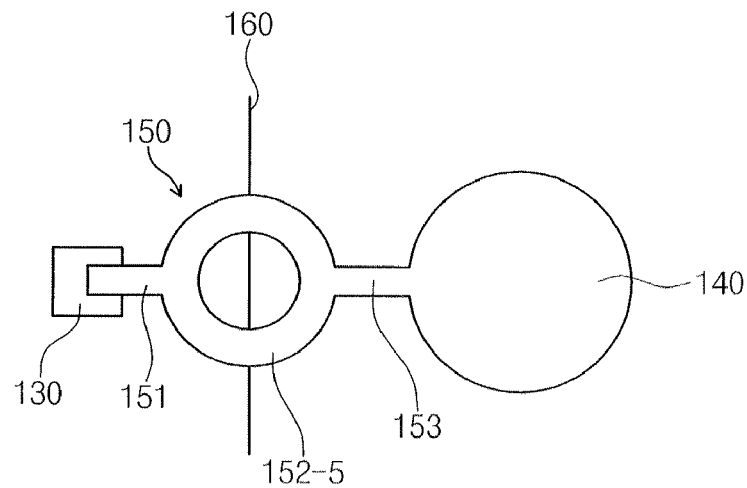

As depicted in FIG. 4, the interconnection 150 may include a second interconnection portion 152-2 having a square shape. As depicted in FIG. 5, the interconnection 150 may include a second interconnection portion 152-3 having a diamond shape. As depicted in FIG. 6, the interconnection 150 may include a second interconnection portion 152-4 having a cross shape. As depicted in FIG. 7, the interconnection 150 may include a second interconnection portion 152-5 having a ring shape.

Figure 8:
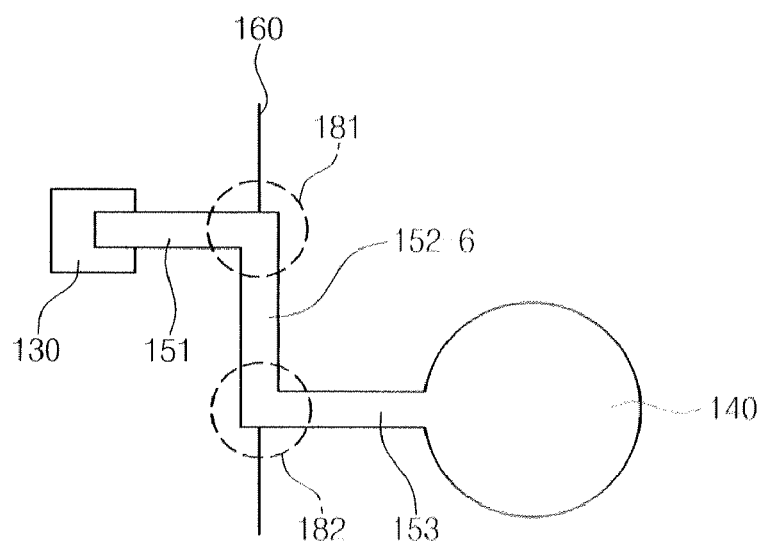

As depicted in FIG. 8, the interconnection 150 may include a second interconnection portion 152-6 having a linear shape extending in a direction which is the same as an extending direction of the interface 160. The interconnection 150 has a first bent portion 181 which is perpendicularly bent between the first interconnection portion 151 and the second interconnection portion 152-6 and a second bent portion 182 which is perpendicularly bent between the second interconnection portion 152-6 and the third interconnection portion 153. Thus, the interconnection 150 can have a structure of a stair shape.

Figure 9:
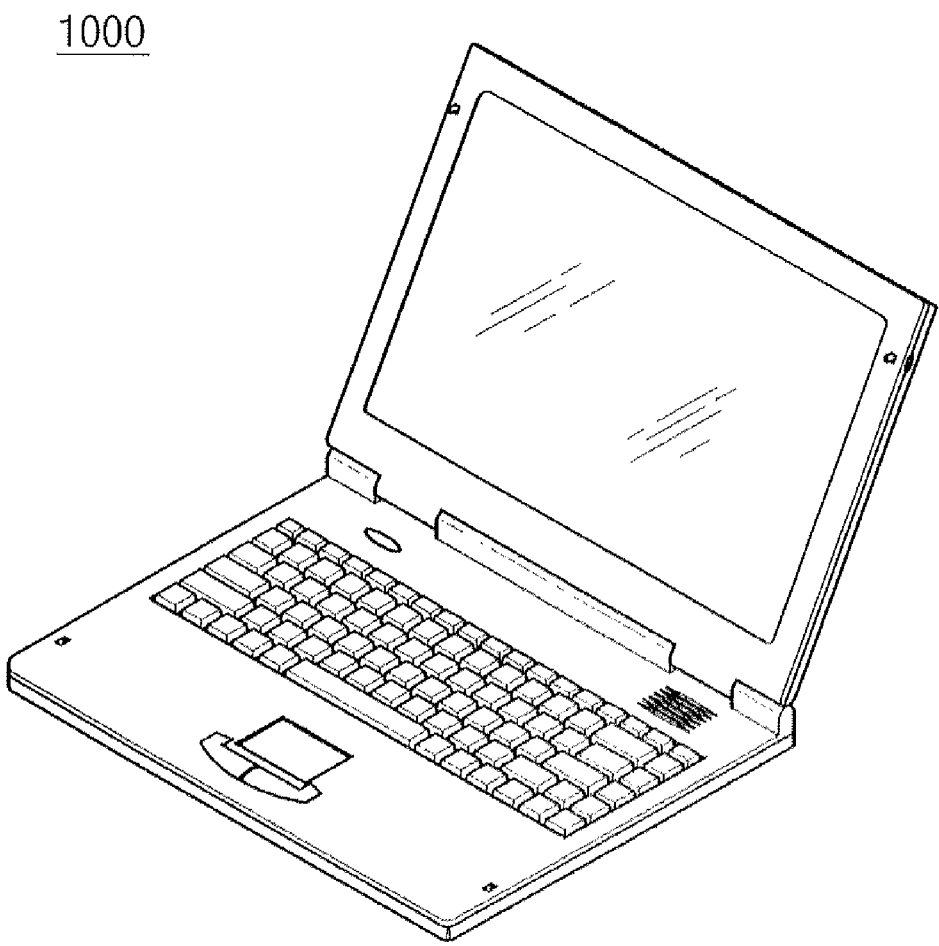
FIG. 9 is a perspective view depicting an example of an electronic device including a semiconductor package in accordance with an embodiment of the present invention.

FIG. 9 is a perspective view depicting an example of an electronic device including a semiconductor package in accordance with an embodiment of the present general inventive concept.

Referring to FIG. 9, the semiconductor package 100 according to an embodiment of the present general inventive concept shown in FIG. 2 may be used in an electronic device 1000 such as a note book. The electronic device 1000 may include a desk top computer, a camcorder, a cellular phone, a game machine, a portable multimedia player (PMP), a memory card, a display device such as LCD and PDP, and various electronic devices. Since the electronic device 1000 includes the semiconductor package 100 in which the interconnection 150 having a superior mechanical characteristic and a superior thermal characteristic is formed, the electronic device 1000 can be used in a severe circumstance without a malfunction.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package, comprising:
   a semiconductor chip;
   a molding layer which molds the semiconductor chip;
   an interconnection which extends crossing an interface between the semiconductor chip and the molding layer, the molding layer being disposed at an outer periphery of the interface and surrounding the semiconductor chip, and the interconnection to connect the semiconductor chip to an outside, wherein a shape of the interconnection is changed along the extended length thereof, and the interconnection includes a first interconnection portion, a second interconnection portion, and a third interconnection portion; and
   a bent portion which is perpendicularly bent between the first and second interconnection portions,
   wherein the first and third interconnection portions do not overlap with the interface, and the second interconnection portion which overlaps with the interface and is perpendicularly disposed between the first and third interconnection portions, and wherein a second width of the second interconnection portion is greater than a first width of the first interconnection portion, the first and second widths being parallel to an extending direction of the interface, and wherein the first interconnection portion has a first linear shape extending in a direction which crosses the interface and the second interconnection portion has a second linear shape extending in a direction along the interface.

2. The semiconductor package of claim 1, further comprising:

an outer terminal which is electrically connected to the interconnection to connect the semiconductor chip to an outside.

3. The semiconductor package of claim 2, wherein the first interconnection portion is electrically connected to the semiconductor chip, the second interconnection portion extends from the first interconnection portion and overlaps with the interface, and wherein the third interconnection portion extends from the second interconnection portion and is electrically connected to the outer terminal.

4. The semiconductor package of claim 3, wherein the third interconnection portion is linear shaped.

5. The semiconductor package of claim 4, wherein the third interconnection portion has the first linear shape extending in a direction which crosses the interface and the second interconnection portion has the second linear shape extending in the direction along the interface.

6. The semiconductor package of claim 5, wherein the interconnection includes a first bent portion which is perpendicularly bent between the first and second interconnection portions and a second bent portion which is perpendicularly bent between the second and third interconnection portions.

7. The semiconductor package of claim 1, wherein a width of the interconnection is changed along the extended length thereof.

8. The semiconductor package of claim 7, wherein a width of a portion of the interconnection which overlaps with the interface is larger than a width of a portion of the interconnection which does not overlap with the interface.

9. An electronic device including the semiconductor package of claim 1.

10. A semiconductor package, comprising:

a semiconductor chip including a plurality of die pads; and a plurality of interconnections, each interconnection connected to a respective die pad among the plurality of die pads to an outside of the semiconductor package, each individual interconnection including an altered shape portion extending across an interface between the semiconductor chip and a molding layer to provide a reinforced strength at the interface, wherein the altered shape portion of the interconnection includes a 90 degree bend to extend along a portion of the interface and a second 90 degree bend to extend perpendicular to the and away from the interface through the semiconductor package, and wherein the altered shape portion of the interconnection is wider than other portions of each interconnection among the plurality of interconnections.

11. The semiconductor of claim 10, wherein the altered shape portion of the interconnection includes a larger cross-sectional area than other portions of the interconnection.

12. The semiconductor package of claim 10, wherein the semiconductor package includes the molding layer surrounding the chip.

* * * * *